United States Patent
Akita et al.

(10) Patent No.: US 6,320,421 B1
(45) Date of Patent: Nov. 20, 2001

(54) LOGIC CIRCUIT

(75) Inventors: Yohei Akita, Kokubunji; Naoki Kato, Kodaira; Kazuo Yano, Hino, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/583,720

(22) Filed: May 30, 2000

(30) Foreign Application Priority Data

Jun. 3, 1999 (JP) .................................................. 11-155925

(51) Int. Cl.$^7$ ............................................... H03K 19/094
(52) U.S. Cl. .............................. 326/113; 326/93; 326/112
(58) Field of Search ............................... 326/113, 93–98, 326/112, 119, 121

(56) References Cited

U.S. PATENT DOCUMENTS

| | | | |
|---|---|---|---|
| 5,280,203 | * 1/1994 | Hung et al. | 307/465 |
| 5,440,245 | * 8/1995 | Galbraith et al. | 326/38 |
| 5,572,151 | * 11/1996 | Hanawa et al. | 326/113 |
| 6,124,736 | * 9/2000 | Yamashita et al. | 326/113 |

FOREIGN PATENT DOCUMENTS

| | | |
|---|---|---|
| 6-45879 | 2/1994 | (JP) . |
| 7-231246 | 8/1995 | (JP) . |

* cited by examiner

Primary Examiner—Michael Tokar
Assistant Examiner—Anh Q. Tran
(74) Attorney, Agent, or Firm—Mattingly, Stanger & Malur, P.C.

(57) ABSTRACT

There is provided a logic circuit causing the same delay time as a conventional logic circuit and acting as a D flip-flop circuit with a data-selecting function.

A logic circuit having the circuitry shown in FIG. 6 will be described briefly. Two transmission gates TG10a (TG10b) and TG11 and two inverters IV10 and IV11 are used to define a data propagation path from an input port I1 (I2) to an output port O1. Thus, four logic gates are located along the path in the same manner as they are in a conventional D flip-flop circuit. The transmission gate TG10a (TG10b) is controlled using a NOR circuit 12a that inputs a clock CLK and a select signal /sel that is the reverse of a select signal sel (NOR circuit 12b that inputs the clock CLK and the select signal sel). The transmission gate TG11 is controlled with the clock CLK. Either of two input data items is selected based on the select signals, and then output.

When a D flip-flop circuit with a data-selecting function that causes the same delay time as a conventional D flip-flop circuit is adapted to a pipeline circuit, the action of the pipeline circuit can be speeded up.

9 Claims, 14 Drawing Sheets

| INPUT | | OUTPUT |
|---|---|---|
| I1 | CLK | O1 |
| L | R | L |
| H | R | H |
| X | F | HOLD |

L : low
H : high
R : rising
F : falling
X : don't care

FIG. 7

| INPUT | | | | | OUTPUT |
|---|---|---|---|---|---|
| I1 | I2 | sel | /sel | CLK | O1 |
| L | X | H | L | R | L |
| H | X | H | L | R | H |
| X | L | L | H | R | L |
| X | H | L | H | R | H |
| X | X | X | X | F | HOLD |

L : low
H : high
R : rising
F : falling
X : don't care

FIG. 16
| INPUT | | | | | | | | | | | OUTPUT |
|---|---|---|---|---|---|---|---|---|---|---|---|
| d1_1 | d1_2 | d2_1 | d2_2 | sel1 | /sel1 | sel2 | /sel2 | sel3 | CLK | /CLK | O1 |
| L | X | X | X | H | L | L | H | H | R | F | L |
| H | X | X | X | H | L | L | H | H | R | F | H |
| X | L | X | X | L | H | H | L | H | R | F | L |
| X | H | X | X | L | H | H | L | H | R | F | H |
| X | X | L | X | H | L | L | H | L | R | F | L |
| X | X | H | X | H | L | L | H | L | R | F | H |
| X | X | X | L | L | H | H | L | L | R | F | L |
| X | X | X | H | L | H | H | L | L | R | F | H |
| X | X | X | X | X | X | X | X | X | F | R | hold |
FIG. 17A  FIG. 17B  FIG. 17C
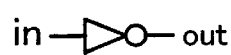
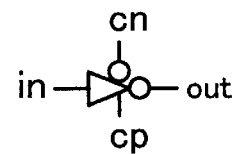
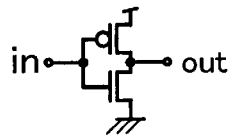
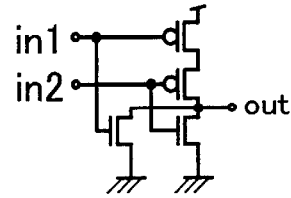
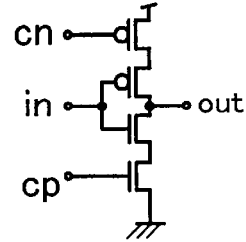

FIG. 18

| INPUT | | | | | | | | | | | | | OUTPUT |
|---|---|---|---|---|---|---|---|---|---|---|---|---|---|
| d1_1 | d1_2 | d2_1 | d2_2 | sel1 | /sel1 | sel2 | /sel2 | gsel | /gsel | g1 | g2 | CLK | O1 |
| L | X | X | X | H | L | L | H | H | L | H | X | R | L |
| L | X | X | X | H | L | L | H | L | H | X | H | R | L |
| H | X | X | X | H | L | L | H | H | L | H | X | R | H |
| H | X | X | X | H | L | L | H | L | H | X | H | R | H |
| X | L | X | X | L | H | H | L | H | L | H | X | R | L |
| X | L | X | X | L | H | H | L | L | L | X | H | R | L |
| X | H | X | X | L | H | H | L | H | L | H | L | R | H |
| X | H | X | X | L | H | H | L | L | L | L | H | R | H |
| X | X | L | X | H | L | L | H | L | L | L | H | R | L |
| X | X | L | X | H | L | L | H | H | L | H | L | R | L |
| X | X | H | X | H | L | L | H | L | L | L | H | R | H |
| X | X | H | X | H | L | L | H | H | L | H | L | R | H |
| X | X | X | L | L | H | H | L | L | L | L | H | R | L |
| X | X | X | L | L | H | H | L | H | L | H | L | R | L |
| X | X | X | H | L | H | H | L | L | L | L | H | R | H |
| X | X | X | H | L | H | H | L | H | L | H | L | R | H |
| X | X | X | X | X | X | X | X | X | X | X | X | F | hold |

LOGIC CIRCUIT

BACKGROUND OF THE INVENTION

1. Field of the Invention

The present invention relates to a logic circuit, or more particularly, to a logic circuit acting as a flip-flop circuit with a data-selecting function.

2. Description of the Related Art

For constructing a logic circuit that acts at a high speed, it is generally known to adopt a pipeline structure. The pipeline structure is such that: flip-flops are included in an combinational circuit; the combinational circuit is divided into a plurality of stages segmented with the flip-flops; and the stages are worked simultaneously in order to carry out processing. Adoption of the pipeline structure improves a throughput and speeds up the action of the whole logic circuit. Thus, the flip-flops serve as basic circuits required for realizing a logic circuit.

FIG. 2 shows an example of a flip-flop circuit employed conventionally. The flip-flop circuit consists of five inverters IV1 to IV5, two tristate inverters TIV1 and TIV2, and two transmission gates TG1 and TG2. The flip-flop circuit inputs a voltage of an input signal I1 developed with the rising of a clock signal CLK that is a reference signal based on which the circuit acts. The flip-flop circuit then outputs the signal through an output port O1 and retains the state thereof until the next rising of the clock signal CLK. FIG. 3 is a truth table indicating the action of the flip-flop circuit shown in FIG. 2.

When the flip-flop circuit shown in FIG. 2 is actually produced, it causes a propagation delay as indicated in the timing chart of FIG. 4. Therefore, a signal is developed at the output port O1 in a certain time (delay time td) after the rising of the clock signal CLK. Moreover, circuit elements causing a propagation delay are interposed between the input port I1 and a node n1 at which data is stored. For this reason, a signal to be applied to the input port I1 must be produced by a time, which is longer than the certain time (setup time ts), earlier than the rising of the clock signal CLK.

FIG. 5 shows an example of a pipeline circuit having a combinational circuit Comb interposed between flip-flop circuits F/F. In the pipeline circuit, a cycle time tcyc is determined with the sum of a delay time caused by the flip-flop circuits themselves (a delay time td plus a setup time ts) and a delay time occurring between the flip-flop circuits (that is, a delay time tcomb caused by the combinational circuit). Whether the delay times can be reduced as much as possible has a significant meaning in designing a pipeline circuit that acts at a high speed. The cycle time tcyc required by the pipeline circuit is expressed as follows:

$$tcyc = ts + td + tcomb \quad (1)$$

For allowing a logic circuit to act at a high speed, the cycle time tcyc must be reduced. However, the combinational circuit Comb cannot be excluded in order to realize a large-scale integration (LSI) having an intended logic function. Moreover, a delay time caused by one circuit element is shorter than that caused by a flip-flop circuit F/F. Therefore, realizing a flip-clop circuit that acts at a high speed is essential to an increase in the speed at which a logic circuit acts.

Circuitry having a flip-flop circuit that includes a circuit element for realizing an added function is known as a means for speeding up the action of a logic circuit using a flip-flop circuit. The circuit has been disclosed in, for example, Japanese Unexamined Patent Publication Nos. 7-231246 and 6-45879.

The Japanese Unexamined Patent Publication No. 7-231246 describes circuitry having a latch circuit, which is a component of a flip-flop circuit, with a NAND function. When the latch circuit having the NAND function is used to construct a flip-flop circuit, an NAND element is substituted for the inverter IV3 or IV5 in the flip-flop circuit shown in FIG. 2. The substitution realizes a flip-flop circuit having the NAND function.

Moreover, the Japanese Unexamined Patent Publication No. 6-45879 describes circuitry having a flip-flop circuit with a data-selecting function. The circuitry is concerned with a flip-flop circuit having a master/slave structure. The flip-flop circuit with a data-selecting function is realized by adding to a master stage a feature for latching a plurality of data items and a feature for selecting one data from the data items and transferring the selected data to a slave stage.

However, in the flip-flop circuit with a data-selecting function disclosed in the Japanese Unexamined Patent Publication No. 6-45879, three circuits must be included for holding data. This leads to a large area. Besides, the number of selectable data items is two.

SUMMARY OF THE INVENTION

Accordingly, an object of the present invention is to provide a logic circuit acting as a flip-flop circuit with a data-selecting function that acts at the same speed as a conventional flip-flop circuit despite its data selecting function for selecting two data items. Nevertheless, the logic circuit with a data-selecting function occupies a smaller area than a conventional flip-flop circuit with a data-selecting function.

Another object of the present invention is to provide a logic circuit acting as a flip-flop circuit with a data-selecting function capable of selecting three or more data items.

A first logic circuit in accordance with the present invention has first and second data input ports, first and second select signal input ports, a reference signal input port, and an output port. Either of first and second data items input through the first and second data input terminals is selected based on select signals of opposite polarities input through the first and second select signal input ports. Data selected based on the select signals synchronously with a reference signal input through the reference signal input port is output through the output port. The first logic circuit thus acts as a two-input flip-flop circuit with a data-selecting function.

The first logic circuit has components described below. Hereinafter, components identical to those shown in FIG. 6 will be assigned the same reference numerals. The first logic circuit consists of a first inverter IV10, a second inverter IV11, a first NOR circuit 12a, a second NOR circuit 12b, a first transmission gate TG10a, a second transmission gate TG10b, and third transmission gate TG11. The first inverter IV10 has an output terminal thereof connected to a first transmission gate through (for example, a transmission gate TG11 in the circuitry shown in FIG. 6). The second inverter IV11 has an output terminal thereof connected to the output port O1. The first NOR circuit 12a has the first select signal input port /sel connected to one input terminal thereof, and has the reference signal CLK applied to the other input terminal thereof. The second NOR circuit 12b has the second select signal input port sel connected to one input terminal thereof and has the reference signal applied to the other input terminal thereof. The first transmission gate TG10a is connected between the first NOR circuit and the input terminal of the first inverter, and controlled based on an output of the first NOR circuit. The second transmission gate TG10*b* is connected between the second data input terminal 12 and the input terminal of the first inverter, and controlled based on an output of the second NOR circuit. The third transmission gate TG11 is connected between the first and second inverters and controlled based on the reference signal input through the reference signal input port.

In the foregoing first logic circuit, the first, second, and third transmission gates may be, like those shown in FIG. 14, realized with n-channel field-effect transistors and p-channel field-effect transistors. In this case, signals used to control the first and second transmission gates include the output signals of the first and second NOR circuits and the reverse signals of the output signals. Signals used to control the third transmission gate include the reference signal and the reverse signal of the reference signal.

A first tristate inverter forming a loop together with the first inverter IV10 may be included for realizing a first latch circuit. A second latch circuit composed of a second tristate inverter and a third inverter may be connected to the input terminal of the second inverter IV11.

A second logic circuit in accordance with the present invention has first, second, third, and fourth data input ports, first, second, third, and fourth select signal input ports, first and second gate input ports, first and second gate-selecting ports, a reference signal input port, and an output port. Either of data items input through the first and second data input ports is selected based on first and second select signals of opposite polarities input through the first and second select signal input ports. Either of data items input through the third and fourth data input ports is selected based on third and fourth select signals of opposite polarities input through the third and fourth select signal input ports. Either of gate input data items input through the first and second gate input ports is selected based on first and second gate select signals of opposite polarities input through the first and second gate-selecting ports. Either of data selected based on the first and second select signals and data selected based on the third and fourth select signals is selected based on gate input data selected based on the first and second gate select signals. The selected data is output through the output port synchronously with the reference signal input through the reference signal input port. Thus, the second logic circuit acts as a four-input flip-flop circuit with a data-selecting function.

The second logic circuit has components described below. Hereinafter, components identical to those shown in FIG. 10 will be assigned the same reference numerals. The second logic circuit includes a circuit for selecting either of data items input through the first and second data input ports (for example, input ports d1_1 and d1_2 in the circuitry shown in FIG. 10). The circuit consists of a first inverter IV10*a*, a first NOR circuit 12*a*, a second NOR circuit 12*b*, a second transmission gate TG10*a*, and a third transmission gate TG10*b*. The first inverter IV10*a* has an output terminal thereof connected to a first transmission gate TG11*a*. The first NOR circuit 12*a* has the first select signal input port /sel1 connected to one input terminal thereof, and has the reference signal CLK applied to the other input terminal thereof. The second NOR circuit 12*b* has the second select signal input port sel1 connected to one input terminal thereof, and has the reference signal applied to the other input terminal thereof. The second transmission gate TG10*a* is connected between the first data input port and the input terminal of the first inverter and controlled based on an output of the first NOR circuit. The third transmission gate TG10*b* is connected between the second data input port and the input terminal of the first inverter and controlled based on an output of the second NOR circuit.

The second logic circuit further includes a circuit for selecting either of data items input through the third and fourth data input ports d2_1 and d2_2. The circuit consists of a second inverter IV10*b*, a third NOR circuit 12*c*, a fourth NOR circuit 12*d*, a fifth transmission gate TG10*c*, and a sixth transmission gate TG10*d*. The second inverter IV10*b* has an output terminal thereof connected to a fourth transmission gate TG11*b*. The third NOR circuit 12*c* has the third select signal input port /sel2 connected to an input terminal thereof, and has the reference signal applied to the other input terminal thereof. The fourth NOR circuit 12*d* has the fourth select signal input port sel2 connected to one input terminal thereof, and has the reference signal applied to the other input terminal. The fifth transmission gate TG10*c* is connected between the third data input port and the input terminal of the second inverter and controlled based on an output of the third NOR circuit. The sixth transmission gate TG10*d* is connected between the fourth data input port and the input terminal of the second inverter and controlled based on an output of the fourth NOR circuit.

The second logic circuit further includes a circuit for selecting either of gate input data items input through the first and second gate input ports g1 and g2. The circuit consists of a third inverter IV10*g*, a fifth NOR circuit 12*ga*, a sixth NOR circuit 12*gb*, a seventh transmission gate TG10*ga*, and an eighth transmission gate TG10*gb*. The fifth NOR circuit 12*ga* has the first gate-selecting port /gsel connected to one input terminal thereof, and has the reference signal applied to the other input terminal thereof. The sixth NOR circuit 12*gb* has the second gate-selecting port gsel connected to one input terminal thereof, and has the reference signal applied to the other input terminal. The seventh transmission gate TG10*ga* is connected between the first gate input port and the input terminal of the third inverter and controlled based on an output of the fifth NOR circuit. The eighth transmission gate TG10*ga* is connected between the second gate input port and the input terminal of the third inverter and controlled based on an output of the sixth NOR circuit.

The second logic circuit further includes a circuit for selecting based on the selected gate input data either of data selected based on the first and second select signals /sel1 and sel1 and data selected based on the third and fourth select signals /sel2 and sel2. The circuit consists of a seventh NOR circuit 14*ga* and an eighth NOR circuit NOR14*gb*. The seventh NOR circuit 14*ga* has the output terminal of the seventh transmission gate connected to one input terminal thereof, and has the reference signal applied to the other input terminal thereof. The seventh NOR circuit 14*ga* has an output terminal thereof connected to a control gate of the first transmission gate TG11*a*. The eighth NOR circuit 14*ga* has the output terminal of the third inverter connected to one input terminal thereof and has the reference signal applied to the other input terminal. The eighth NOR circuit 14*gb* has an output terminal thereof connected to a control gate of the fourth transmission gate TG11*b*.

The second logic circuit further includes a fourth inverter IV11 for outputting data selected based on the selected gate input data through the output port. The fourth inverter IV11 has an input terminal thereof connected to the first transmission gate and fourth transmission gate, and has an output terminal thereof connected to the output port.

In the foregoing second logic circuit, the first to eighth transmission gates may be, like those shown in FIG. 10, realized with n-channel field-effect transistors and p-channel field-effect transistors. In this case, signals used to control the first transmission gate TG11*a* include an output signal of the seventh NOR circuit 14gb and the reverse signal of the output signal. Signals used to control the second transmission gate TG10a include an output signal of the first NOR circuit 12a and the reverse signal of the output signal. Signals used to control the third transmission gate TG10b include an output signal of the second NOR circuit 12b and the reverse signal of the output signal. Signals used to control the fourth transmission gate TG11b include an output signal of the eighth NOR circuit 14gb and the reverse signal of the output signal. Signals used to control the fifth transmission gate TG10c include an output signal of the third NOR circuit 12c and the reverse signal of the output signal. Signals used to control the sixth transmission gate TG10d include an output signal of the fourth NOR circuit 12d and the reverse signal of the output signal. Signals used to control the seventh transmission gate TG10ga include an output signal of the fifth NOR circuit 12ga and the reverse signal of the output signal. Signals used to control the eighth transmission gate TG10ga include an output signal of the sixth NOR circuit 12gb and the reverse signal of the output signal.

Furthermore, a first tristate inverter TIV11a forming a loop together with the first inverter IV10a may be included for realizing a first latch circuit. A second tristate inverter TIV11b forming a loop together with the second inverter IV10b maybe included for realizing a second latch circuit. A third tristate inverter TIV11g forming a loop together with the third inverter IV10g may be included for realizing a third latch circuit. A fourth latch circuit composed of a fourth tristate inverter TIV12 and a fifth inverter IV12 may be connected to the input terminal of the fourth inverter IV11.

Moreover, a third logic circuit in accordance with the present invention has first, second, third, and fourth data input ports, first, second, third, fourth, and fifth select signal input ports, a reference signal input port, and an output port. Either of data items input through the first and second data input ports is selected based on first and second select signals of opposite polarities input through the first and second select signal input ports. Either of data items input through the third and fourth data input ports is selected based on the third and fourth select signal input through the third and fourth select signal input ports. Either of data selected based on the first and second select signals and data selected based on the third and fourth select signals is selected based on a fifth select signal input through the fifth select signal input port. The selected data is output through the output port synchronously with a reference signal input through the reference signal input port. The third logic circuit acts as a four-input flip-flop circuit with a data-selecting function.

The third logic circuit has components described below. Hereinafter, components identical to those shown in FIG. 15 will be assigned the same reference numerals. The third logic circuit includes a circuit for selecting either of data items input through the first and second data input ports (for example, input ports d1_1 and d1_2 in the circuitry shown in FIG. 15). The circuit consists of a first inverter IV10a, a first NOR circuit 12a, a second NOR circuit 12b, a second transmission gate TG10a, and a third transmission gate TG10b. The first inverter IV10a has an output terminal thereof connected to the first transmission gate TG11a. The first NOR circuit 12a has the first select signal input port /sel1 connected to one input terminal thereof, and has the reference signal CLK applied to the other input terminal. The second NOR circuit 12b has the second select signal input port sel1 connected to one input terminal thereof, and has the reference signal applied to the other input terminal thereof. The second transmission gate TG10a is connected between the first data input port and the input terminal of the first inverter, and controlled based on an output of the first NOR circuit. The third transmission gate TG10b is connected between the second data input port and the input terminal of the first inverter, and controlled based on an output of the second NOR circuit.

The third logic circuit further includes a circuit for selecting either of data items input through the third and fourth input terminals d2_1 and d2_2. The circuit consists of a second inverter IV10b, a third NOR circuit 12c, a fourth NOR circuit 12d, a fifth transmission gate TG10c, and a sixth transmission gate TG10d. The second inverter TV10b has an output terminal thereof connected to the fourth transmission gate TG11b. The third NOR circuit 12c has the third select signal input port /sel2 connected to one input terminal thereof, and has the reference signal applied to the other input terminal thereof. The fourth NOR circuit 12d has the fourth select signal input port sel2 connected to one input terminal thereof, and has the reference signal applied to the other input terminal thereof. The fifth transmission gate TG10c is connected between the third data input port and the input terminal of the second inverter, and controlled based on an output of the thirdNOR circuit. The sixth transmission gate TG10d is connected between the fourth data input port and the input terminal of the second inverter, and controlled based on an output of the fourth NOR circuit.

The third logic circuit further includes a circuit for selecting either of data selected based on the first and second select signals and data selected based on the third and fourth select signals. The circuit consists of a third inverter IV10g, a seventh transmission gate TG10g, a fifth NOR circuit 14ga, and a sixth NOR circuit 14gb. The seventh transmission gate TG10g has an input terminal thereof connected to the fifth select signal input port sel3, and has an output terminal thereof connected to the input terminal of the third inverter. The fifth NOR circuit 14ga has the output terminal of the seventh transmission gate connected to one input terminal thereof and has the reference signal applied to the other input terminal thereof. The fifth NOR circuit 14ga has an output terminal thereof connected to a control gate of the first transmission gate TG11a. The sixth NOR circuit 14ga has the output terminal of the third inverter connected to one input terminal thereof, and has the reference signal applied to the other input terminal thereof. The sixth NOR circuit 14gb has an output terminal thereof connected to a control gate of the fourth transmission gate TG11b.

The third logic circuit further includes a fourth inverter IV11 for outputting the selected data through the output port. The fourth inverter IV11 has an input terminal thereof connected to the first transmission gate and fourth transmission gate, and has an output terminal thereof connected to the output port.

In the foregoing third logic circuit, the first to seventh transmission gates may be, like those shown in FIG. 15, realized with n-channel field-effect transistors and p-channel field-effect transistors. In this case, signals used to control the first transmission gate TG11a include an output signal of the fifth NOR circuit 14ga and the reverse signal of the output signal. Signals used to control the second transmission gate TG10a include an output signal of the first NOR circuit 12a and the reverse signal of the output signal. Signals used to control the third transmission gate TG10b include an output signal of the second NOR circuit 12b and the reverse signal of the output signal. Signals used to control the fourth transmission gate TG11b include an output signal of the sixth NOR circuit 14gb and the reverse signal of the output signal. Signals used to control the fifth transmission gate TG10c include an output signal of the third NOR circuit 12c and the reverse signal of the output signal. Signals used to control the sixth transmission gate TG10d include an output signal of the fourth NOR circuit 12d and the reverse signal of the output signal. Signals used to control the seventh transmission gate TG10g include the reference signal and the reverse signal of the reference signal.

Furthermore, a first tristate inverter TIV11a forming a loop together with the first inverter IV10a may be included for realizing a first latch circuit. A second tristate inverter TIV11b forming a loop together with the second inverter IV10b may be included for realizing a second latch circuit. A third tristate inverter TIV11g forming a loop together with the third inverter IV10g may be included for realizing a third latch circuit. A fourth latch circuit composed of a fourth tristate inverter TIV12 and a fifth inverter IV12 may be connected to the input terminal of the fourth inverter IV11.

BRIEF DESCRIPTION OF THE DRAWINGS

FIG. 7 is a truth table indicating the action of the circuit shown in FIG. 6;

FIG. 16 is a truth table indicating the action of the circuit shown in FIG. 15;

FIG. 17A shows the correspondence between a symbol representing a logic gate that is an inverter and symbols representing transistors;

FIG. 17B shows the correspondence between a symbol representing a logic gate that is a NOR gate and symbols representing transistors;

FIG. 17C shows the correspondence between a symbol representing a logic gate that is a tristate inverter and symbols representing transistors;

FIG. 18 is a truth table indicating the action of the circuit shown in FIG. 10.

DESCRIPTION OF THE PREFERRED EMBODIMENTS

Figure 1:
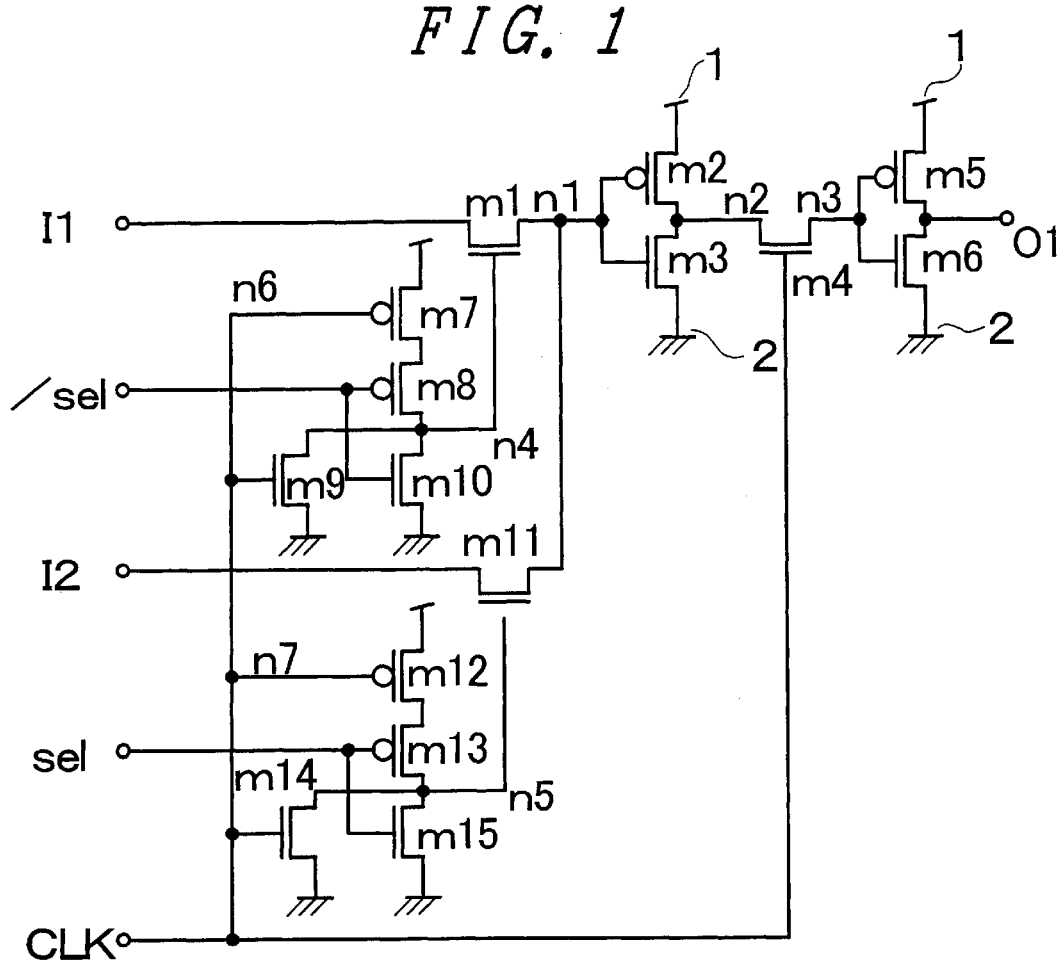
FIG. 1 is a circuit diagram showing the circuitry of a logic circuit, which acts as a two-input flip-flop circuit with a data-selecting function, in accordance with an embodiment of the present invention.

A description will be made of logic circuits in accordance with a preferred embodiment of the present invention. Hereinafter, reference numerals denoting ports shall also refer to lines and signals. A reference numeral denoting a power supply shall also refer to a voltage developed at the power supply.

Figure 6:
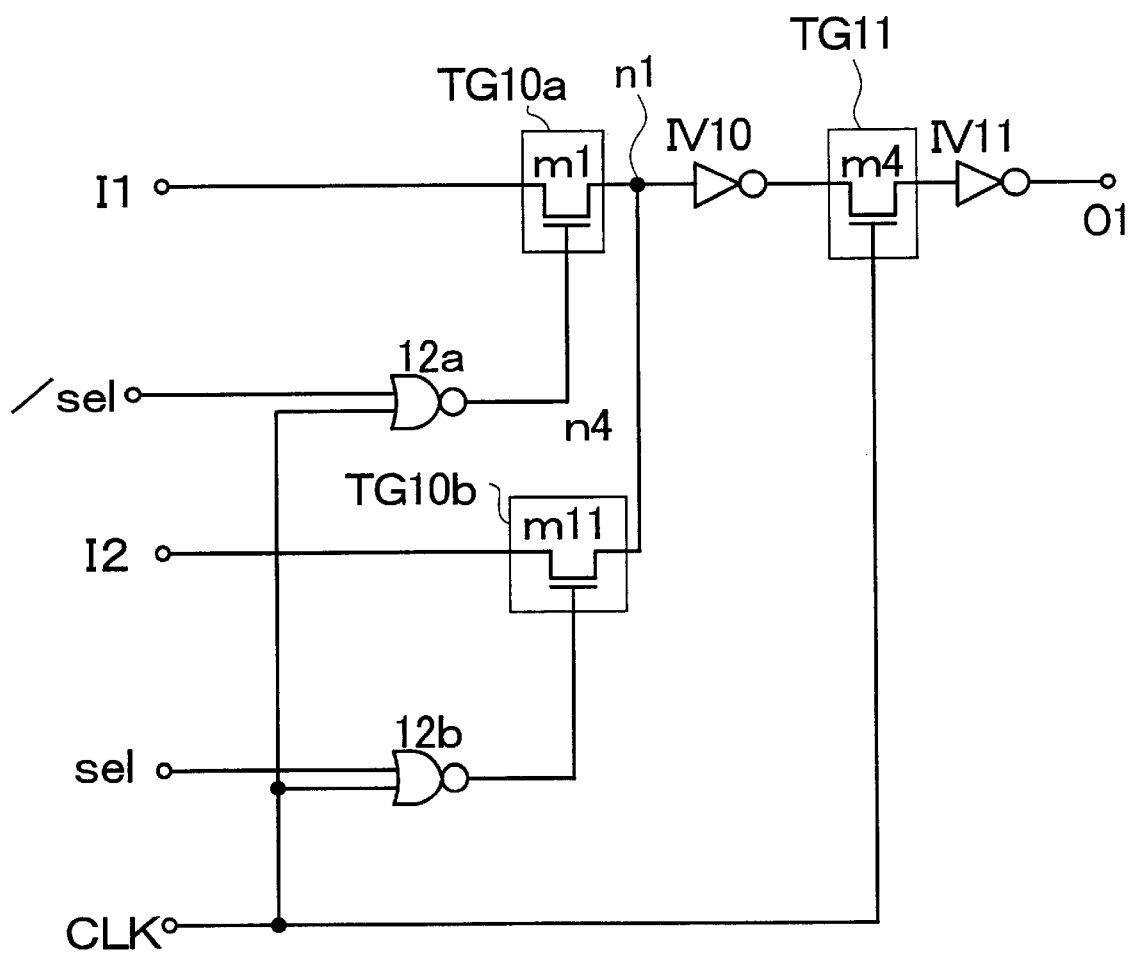
FIG. 6 is a circuit diagram showing the two-input flip-flop circuit with a data-selecting function shown in FIG. 1 using logic gates.

As shown in FIG. 6, a logic circuit in accordance with the present invention consists of two inverters IV10 and IV11, two NOR circuits 12a and 12b, and three transmission gates TG10a, TG10b, and TG11 realized with n-channel MOS (hereinafter NMOS) transistors m1, m4, and m11. The NMOS transistor m1 has a source-drain channel thereof connected between the first input data port I1 and an internal node n1. The NMOS transistor m1 has a gate thereof controlled with an output of the NOR circuit 12a that inputs a select signal /sel and a clock signal CLK. The NMOS transistor m11 has a source-drain channel thereof connected between the second input port I2 and internal node n1, and has a gate thereof controlled with an output of the NOR circuit 12b that inputs a select signal sel and the clock signal CLK. Herein, a slash / is a substitution of an upper bar meaning negation or reverse. The NMOS transistor m4 has a source-drain channel thereof connected between the inverters IV10 and IV11, and has a gate thereof controlled with the clock signal CLK.

The logic circuit having the foregoing components acts as a flip-flop circuit with a data-selecting function (hereinafter, a flip-flop circuit with a function). The logic circuit receives either of two input data items I1 and I2 synchronously with the rising of the clock signal CLK, and outputting the received data through the output port O1 thereof. Whichever of the input data items I1 and I2 is received is determined with the select signals sel and /sel. When the select signal sel is high, the data at the input port I1 is received. When the select signal /sel is high, the data at the input port I2 is received.

Figure 9:
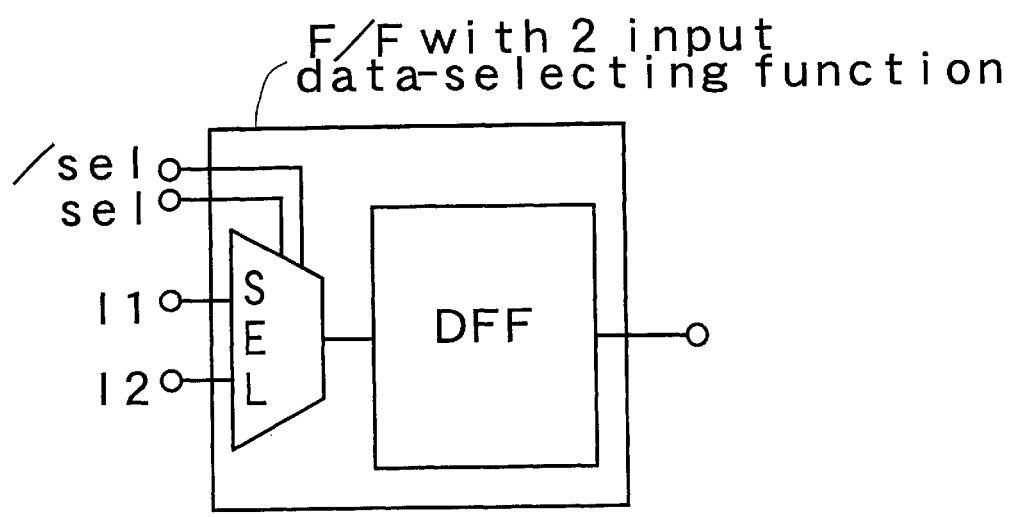
FIG. 9 shows an equivalent circuit of the circuit shown in FIG. 6.

FIG. 7 is a truth table indicating the action of the flip-flop circuit with a data-selecting function. FIG. 9 shows an equivalent circuit of the flip-flop circuit. The equivalent circuit is realized with a cascade connection of a two-input data selecting circuit SEL and a D flip-flop circuit DFF.

Figure 2:
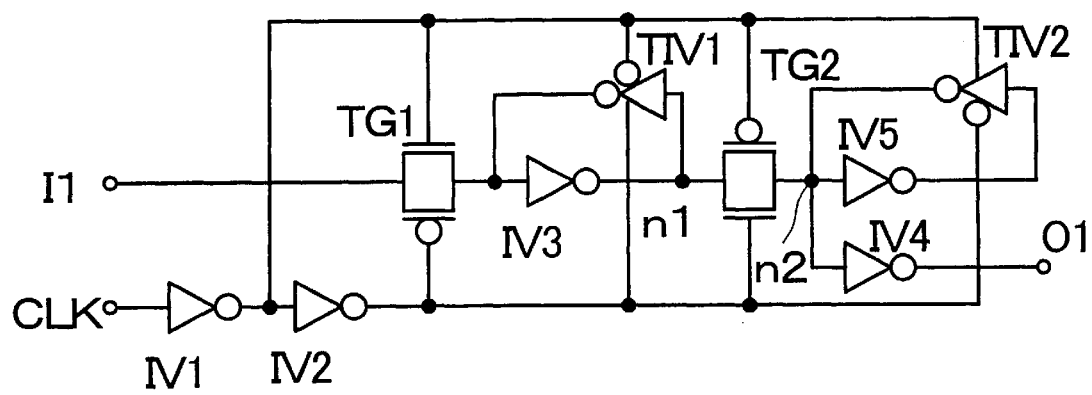
FIG. 2 is a circuit diagram showing a conventional flip-flop circuit.
Figures 3, 4:
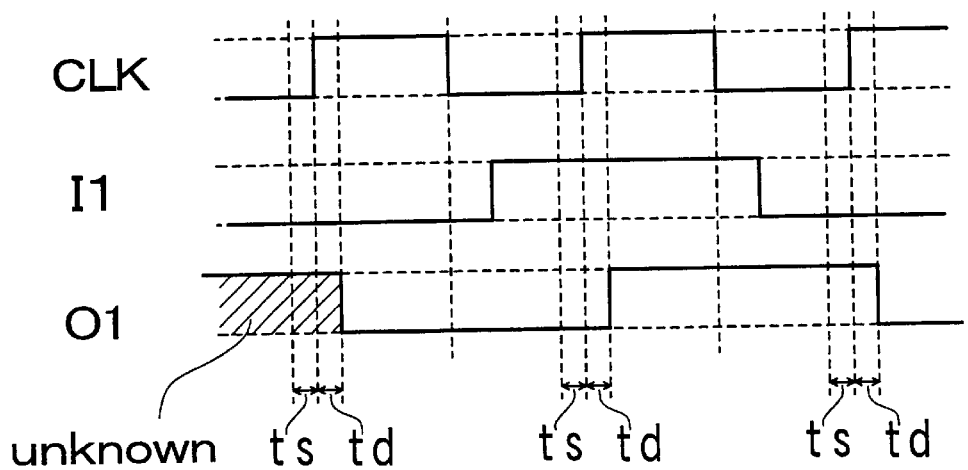
FIG. 3 is a truth table indicating the action of the conventional flip-flop circuit shown in FIG. 2.
FIG. 4 is a timing chart indicating the action of the conventional flip-flop circuit.

The flip-flop circuit with a function is characterized in that despite the addition of a data-selecting function, a delay time occurring from the data input port I1 or I2 to the output port O1 is the same as that occurring in the conventional flip-flop circuit shown in FIG. 2.

In the conventional flip-flop circuit shown in FIG. 2, circuit elements through which a signal passes while transferred from the input port I1 to the output port O1 include four logic gates such as the transmission gate TG1, inverter IV3, transmission gate TG2, and inverter IV4.

In contrast, in the flip-flop circuit with a function shown in FIG. 6, circuit elements located along the path of a signal from the input port I1 (I2) to the output port O1 include the same four logic gates as those in the conventional flip-flop circuit. Namely, the four logic gates are the transmission gate TG10a (TG10b), inverter IV10, transmission gate TG11, and inverter IV11.

When the flip-flop circuit with a function in accordance with the present embodiment is employed, compared with when the conventional flip-flop circuit is employed, a data-selecting function can be added with a delay time held unchanged.

The logic circuit in accordance with the preferred embodiment of the present invention has, fundamentally, the same circuitry as of the conventional D flip-flop circuit shown in FIG. 2. However, the transmission gate TG1 included in a master stage of the conventional D flip-flop circuit shown in FIG. 2 is duplicated in order to use two transmission gates TG10a and TG10b. Moreover, NOR circuits 12a and 12b are used to give control according to a logic that permits either of the transmission gates to feed data to a slave stage of the D flip-flop circuit. Thus, a two-input D flip-flop circuit with a data-selecting function is realized without an increase in a delay time.

Figure 5:
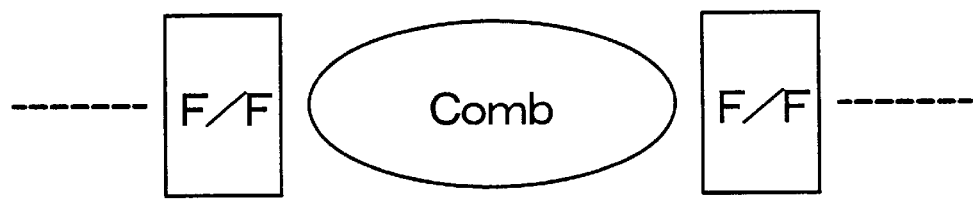
FIG. 5 is an explanatory diagram showing an example of a pipeline circuit.

Normally, a pipeline circuit has, like the circuitry shown in FIG. 5, a combinational circuit Comb interposed between conventional flip-flop circuits F/F. A cycle time tcyc required by the whole pipeline circuit is determined as mentioned previously with the sum of (a setup time ts required by the flip-flop circuits)+(a delay time td caused by the flip-flop circuits)+(a delay time tcomb caused by the combinational circuit).

Figure 8A:
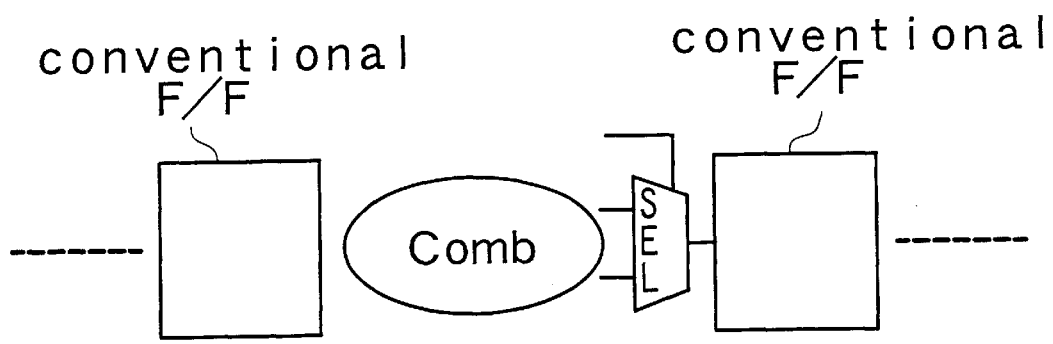
FIG. 8A is an explanatory diagram showing an example of the circuitry of a pipeline circuit having conventional flip-flop circuits.
Figure 8B:
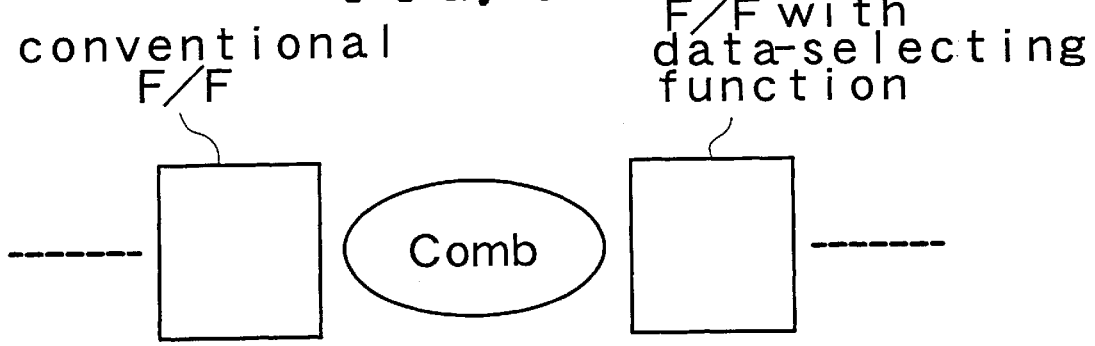
FIG. 8B is an explanatory diagram showing an example of the circuitry of a pipeline circuit having a flip-flop circuit with a data-selecting function in accordance with the present invention.

Assume that the conventional flip-flop circuit F/F and a selector circuit SEL in a previous stage which are shown in FIG. 8A are, as shown in FIG. 8B, replaced with the aforesaid flip-flop circuit with a data-selecting function. In this case, the delay time td caused by the flip-flop circuits remains unchanged between before and after the replacement. However, the delay time tcomb caused by the combinational circuit Comb is reduced by a delay time caused by the selector SEL. Consequently, the cycle time tcyc required by the pipeline circuit can be reduced by a time required by one stage of the selector. Thus, the action of the whole pipeline circuit can be speeded up.

Moreover, the flip-flop circuit with a data-selecting function for selecting either of two inputs, which is described in the Japanese Unexamined Patent Publication No. 6-45879, requires three circuits for holding data. The circuitry shown in FIG. 6 obviates the necessity of the data holding circuits. This is advantageous because an area required is diminished by an area occupied by the three data holding circuits.

Referring to FIG. 6, the transmission gates TG10a, TG10b, and TG11 are realized with NMOS transistors alone. Needless to say, the transmission gates may be realized with CMOS transistors each having a p-channel MOS (hereinafter, PMOS) transistor connected in parallel with an NMOS transistor so that the actions of the transmission gates will not be limited by the threshold voltages of the NMOS transistors. In this case, an inverter for producing a reverse signal whose polarity is opposite to that of a signal used to drive the gates of the NMOS transistors is needed to drive the gates of the PMOS transistors.

When the circuit shown in FIG. 6 is expressed using transistor symbols, the circuit shown in FIG. 1 ensues. In FIG. 1, there are shown a first operating voltage 1 (normally, a power supply voltage to be fed to circuits), a second operating voltage 2 (normally, a ground voltage), and internal nodes n1 to n7. The inverter IV10 in FIG. 6 is realized with a CMOS inverter composed of a PMOS transistor m2 and an NMOS transistor m3 interposed between a power supply at which the power supply voltage 1 is developed and a ground at which the ground voltage 2 is developed. The inverter IV11 is realized with a CMOS inverter composed of a PMOS transistor m5 and an NMOS transistor m6. The NOR circuit 12a is composed of PMOS transistors m7 and m8 and NMOS transistors m9 and m10. The NOR circuit 12b is composed of PMOS transistors m12 and m13 and NMOS transistors m14 and m15.

The select signal input port /sel is connected to the gates of the PMOS transistor m8 and NMOS transistor m10. The select signal input port sel is connected to the gates of the PMOS transistor m13 and NMOS transistor m15. The clock input port CLK is connected to the gates of the PMOS transistors m7 and m12 and those of the NMOS transistors m4, m9, and m14. This results in the circuit shown in FIG. 6.

In FIG. 1, the same reference numerals are assigned to components identical to those shown in FIG. 6. The same applies to the drawings to be referenced in conjunction with subsequent examples.

FIG. 17A to FIG. 17C each show the correspondence between a symbol representing a logic gate and symbols representing transistors. FIG. 17A shows an inverter, FIG. 17B shows a NOR gate, and FIG. 17C shows a tristate inverter.

Next, practical examples of a logic circuit in accordance with the present invention will be detailed with reference to the appended drawings below.

FIRST EXAMPLE

Figure 14:
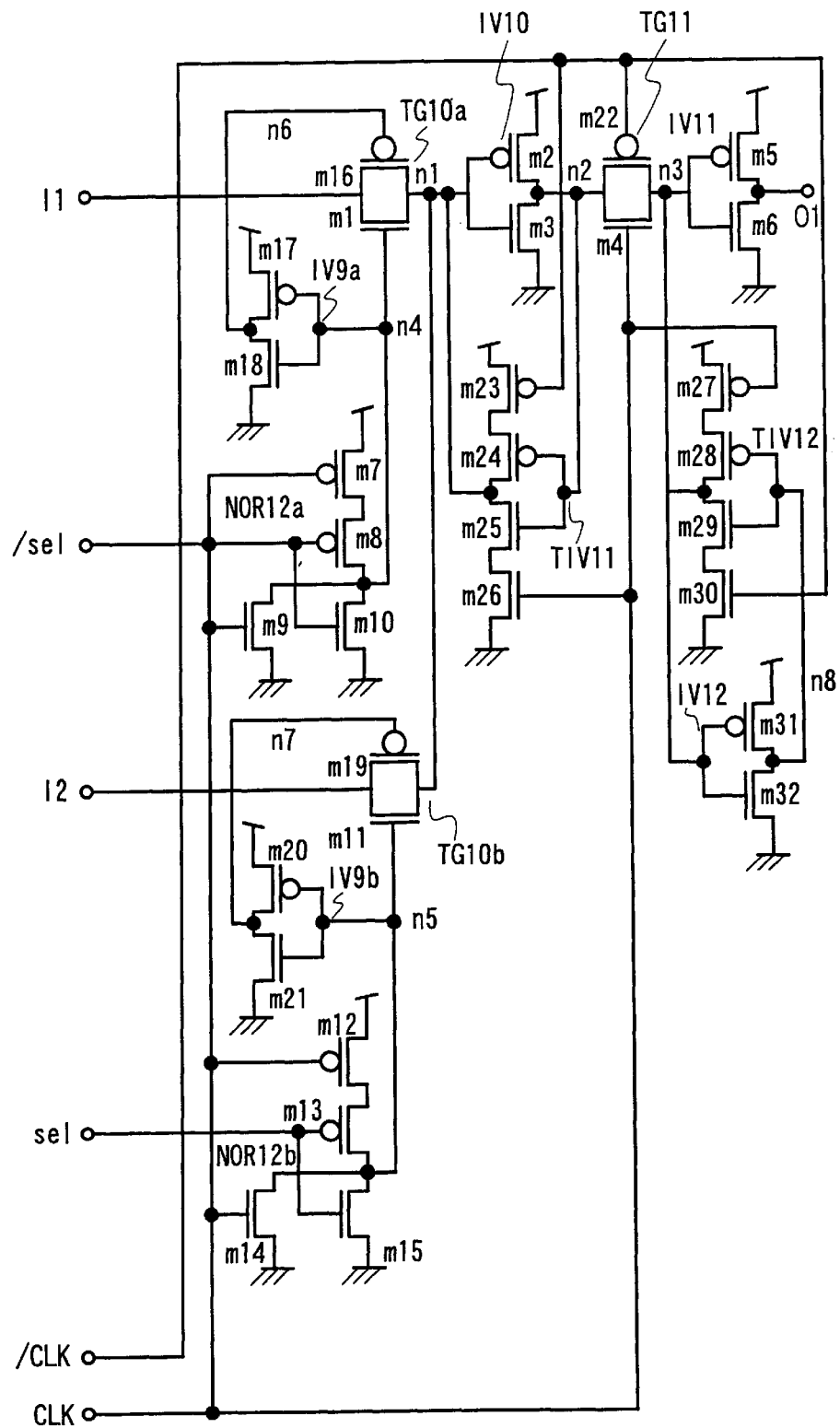
FIG. 14 is a circuit diagram showing another example of a logic circuit in accordance with the present invention, that is, a two-input flip-flop circuit with a data-selecting function.

FIG. 14 is a circuit diagram showing an example of a logic circuit in accordance with the present invention. The example serves as a flip-flop circuit with a data-selecting function for selecting either of two input data items. The basic circuitry shown in FIG. 1 and FIG. 6 and described in conjunction with the embodiment is adopted. Differences from the basic circuitry lie in that: the transmission gates TG10a, TG10b, and TG11 in FIG. 6 are realized with CMOSs; the inverter IV10 and tristate inverter are included to form a loop and thus construct a latch circuit; and a latch circuit composed of a CMOS inverter and tristate inverter is included for applying an output O1 to the input terminal of the inverter IV11 on a stable basis.

In practice, a CMOS inverter IV9a composed of a PMOS transistor m17 and an NMOS transistor m18 is included for feeding a reverse signal developed at a node n4 to the gate of a PMOS transistor m16 that is an integral part of a transmission gate TG10a. Likewise, a CMOS inverter IV9b composed of a PMOS transistor m20 and an NMOS transistor m21 is included for feeding a reverse signal developed at a node n5 to the gate of a PMOS transistor m20 that is an integral part of a transmission gate TG10b.

A latch circuit is composed of a tristate inverter TIV11, which consists of PMOS transistors m23 and m24 and NMOS transistors m25 and m26, and a CMOS inverter IV10 consisting of a PMOS transistor m2 and an NMOS transistor m3. A latch circuit is composed of a tristate inverter TIV12, which consists of PMOS transistors m27 and m28 and NMOS transistors m29 and m30, and a CMOS inverter IV12 consisting of a PMOS transistor m31 and an NMOS transistor m32.

A reverse signal input port /CLK is included for inputting the reverse signal of a clock signal. The reverse clock signal /CLK is fed to the PMOS transistor m22 included in the transmission gate TG11, the PMOS transistor included in the tristate inverter TIV11, and the NMOS transistor m30 included in the tristate inverter TIV12.

The reverse clock signal /CLK may be, as shown in FIG. 2, produced using an inverter to be connected to the clock signal input port CLK. In FIG. 14, there are shown internal nodes n1 to n8.

The logic circuit of this example having the foregoing components act, similarly to those shown in FIG. 1 and FIG. 6, as a flip-flop circuit with a data-selecting function for selecting either of two input data items. Specifically, either of input data items I1 and I2 is received synchronously with the rising of the clock signal CLK, and the received data is output through the output port O1.

Whichever of the input data items I1 and I2 is received is determined with select signals sel and /sel. When the select signal sel is high, data at the input port I1 is received. When the select signal /sel is high, data at the input port I2 is received. The select signals sel and /sel have mutually opposite polarities. The truth table indicating the action of the flip-flop circuit with a function shown in FIG. 14 is the same as the truth table of FIG. 7 indicating the action of the circuits shown in FIG. 1 and FIG. 6. The truth table is therefore omitted.

Even in the flip-flop circuit with a function of this example, similarly to those shown in FIG. 1 and FIG. 6, despite the addition of the data-selecting function, a delay time occurring from the input port I1 or I2 to the output port O1 is the same as that occurring in the conventional flip-flop circuit shown in FIG. 2. Specifically, the flip-flop circuit with a function shown in FIG. 14 has four logic gates, that is, the transmission gate TG10a, inverter IV10, transmission gate TG11, and inverter IV11, and thus has the same number of logic gates as the conventional flip-flop circuit. The transmission gate TG10a consists of MOS transistors m1 and m16, the inverter IV10 consists of the MOS transistors m1 and m16, the transmission gate TG11 consists of the MOS transistor m4 and m22, and the inverter IV11 consists of the MOS transistors m5 and m6.

Circuit elements located along the path of a signal from the input port I2 to the output port O1 in FIG. 14 are four logic gates, that is, the transmission gate TG10b, inverter IV10, transmission gate TG11, and inverter IV11. The transmission gate TG10b consists of the MOS transistors m11 and m19, the inverter IV10 consists of the MOS transistors m2 and m3, the transmission gate TG11 consists of the MOS transistors m4 and m22, and the inverter IV11 consists of the MOS transistors m5 and m6.

The capacitance of the internal node n1 included in the flip-flop circuit with a data-selecting function shown in FIG. 14 is larger that that included in with the conventional flip-flop circuit shown in FIG. 2. This is because the number of circuit elements connected to the node n1 is larger. Consequently, a delay time caused by a circuit preceding or succeeding the internal node n1 increases a little. However, a delay time caused by any other circuit is identical to that caused by a counterpart included in the conventional flip-flop circuit. Eventually, a delay time (a setup time ts plus a delay time td) caused by the flip-flop circuit with a data-selecting function is nearly identical to that caused by the conventional flip-flop circuit.

When the flip-flop circuit with a data-selecting function of this example is used to construct a circuit, compared with when the conventional flip-flop circuit is used, it is more advantageous because the data-selecting function can be added with a delay time held intact.

Moreover, compared with the flip-flop circuit with a data-selecting function described in the Japanese Unexamined Patent Publication No. 6-45879, the number of latch circuits for holding data included in the circuit shown in FIG. 14 is as small as two. This is advantageous in that an area to be occupied can be reduced accordingly.

SECOND EXAMPLE

Figure 10:
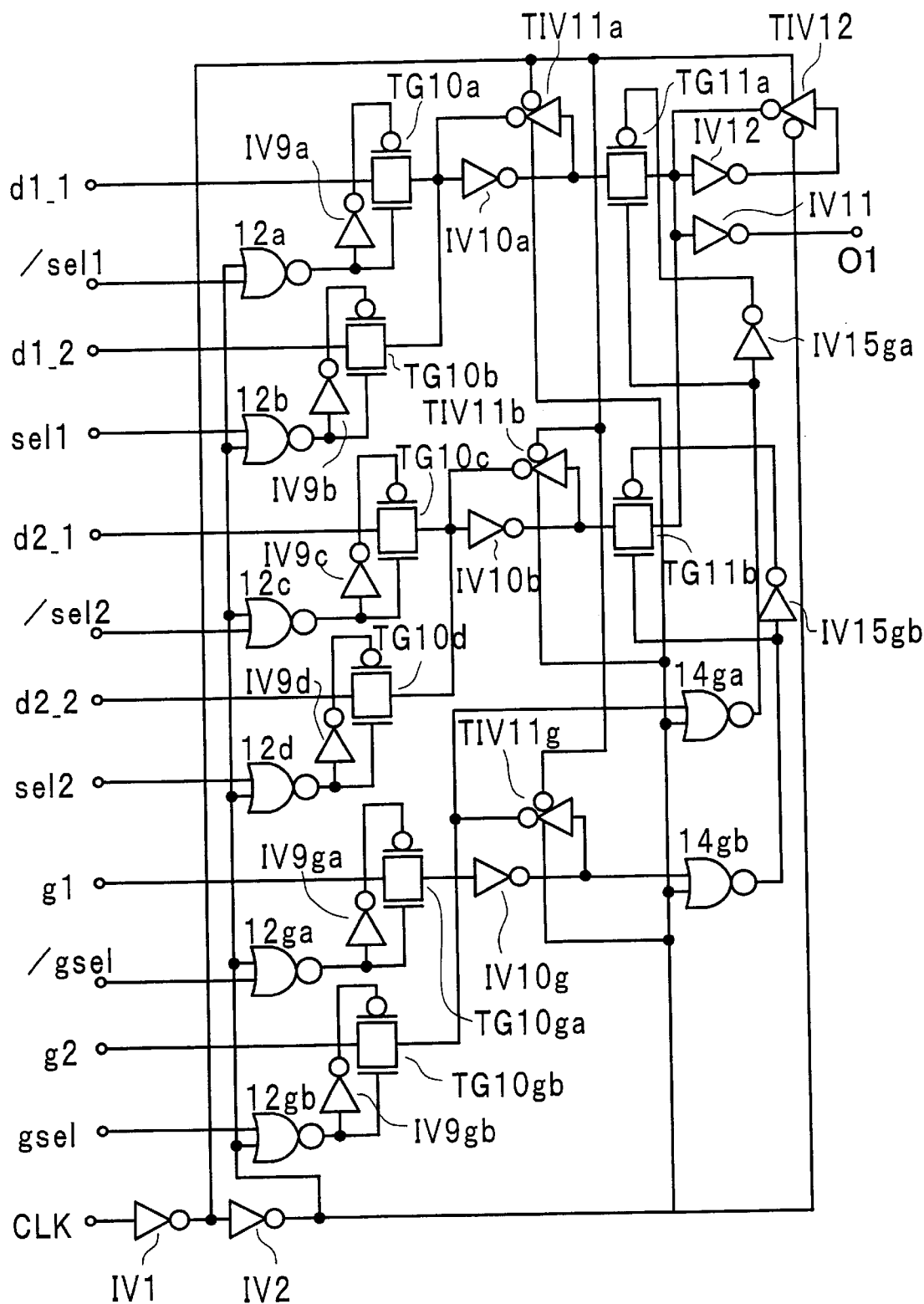
FIG. 10 is a circuit diagram showing an example of a logic circuit in accordance with the present invention, that is, a four-input flip-flop circuit with a data-selecting function.

FIG. 10 is a circuit diagram showing another example of a logic circuit in accordance with the present invention using logic gates. In this example, a flip-flop circuit with a data-selecting function for selecting any of four inputs is constructed based on the flip-flop circuit with a data-selecting function for selecting either of two inputs that is the first example shown in FIG. 14.

Referring to FIG. 10, input ports d1_1 and d1_2 correspond to the input ports I1 and I2 in FIG. 14, and select signals /sel1 and sel1 correspond to the select signals /sel and sel in FIG. 14. Two NOR circuits 12a and 12b, three inverters IV9a, IV9b, and IV10a, two transmission gates TG10a and TG10b, and a tristate inverter TIV11a constitute one master stage of a flip-flop circuit with a selecting function having a master/slave structure. The master stage selects either of two input data items d1_1 and d1_2.

Likewise, the other master stage of the flip-flop circuit with a selecting function is composed of two NOR circuits 12c and 12d, three inverters IV9c, IV9d, and IV10b, two transmission gates TG10c and TG10d, and a tristate inverter TIV11b. The master stage selects either of two input data items d2_1 and d2_2.

A gate-selecting circuit for selecting either of two input data items selected by the two master stages is composed of four NOR circuits 12ga, 12gb, 14ga, and 14gb, five inverters Iv9ga, IV9gb, IV10, IV15ga, and IV15gb, and a tristate inverter TIV11g. Input ports g1 and g2 and gate-selecting ports gsel and /gsel are included in the gate-selecting circuit. The input port g1 is connected to the input terminal of the transmission gate TG10ga, and the input port g2 is connected to the input terminal of the transmission gate TG10gb. The gate-selecting port /gsel is connected to one input terminal of the NOR circuit 12ga, and the gate-selecting port gsel is connected to the other input terminal of the NOR circuit 12gb.

The gates of the transmission gates TG11a and TG11b are driven using the output signals of the NOR circuits 14ga and 14gb and those of the inverters IV15ga and 15gb instead of using the clock signals CLK and /CLK that are used in the first example. The transmission gates TG11a and TG11b constitute a slave stage of the flip-flop circuit. The NOR circuits 14ga and 14gb and the inverters IV15ga and 15gb are included in the gate-selecting circuit. Outputs of the transmission gates TG11a and TG11b are provided through the output port O1 via the inverter IV11.

The clock signal CLK is inverted by the inverter IV11, whereby a reverse signal /CLK is produced. The reverse signal /CLK is applied to the gates of PMOS transistors included in the tristate inverters TIV11a, TIV11b, and TIV11g, and to the gate of an NMOS transistor included in the tristate inverter TIV12. The clock signal CLK passed through the inverters IV1 and IV2 is applied to the gates of NMOS transistors included in the tristate inverters TIV11a, TIV11b, and TIV11g, the gate of a PMOS transistor included in the tristate inverter TIV12, and the other input terminals of the NOR circuits 12a to 12d, 12ga, 12gb, 14ga, and 14gb.

For providing an output O1 on a stable basis, similarly to the first example, a latch circuit composed of an inverter IV12 and a tristate inverter TIV12 is connected in the input stage of the output port O1.

Figure 11:
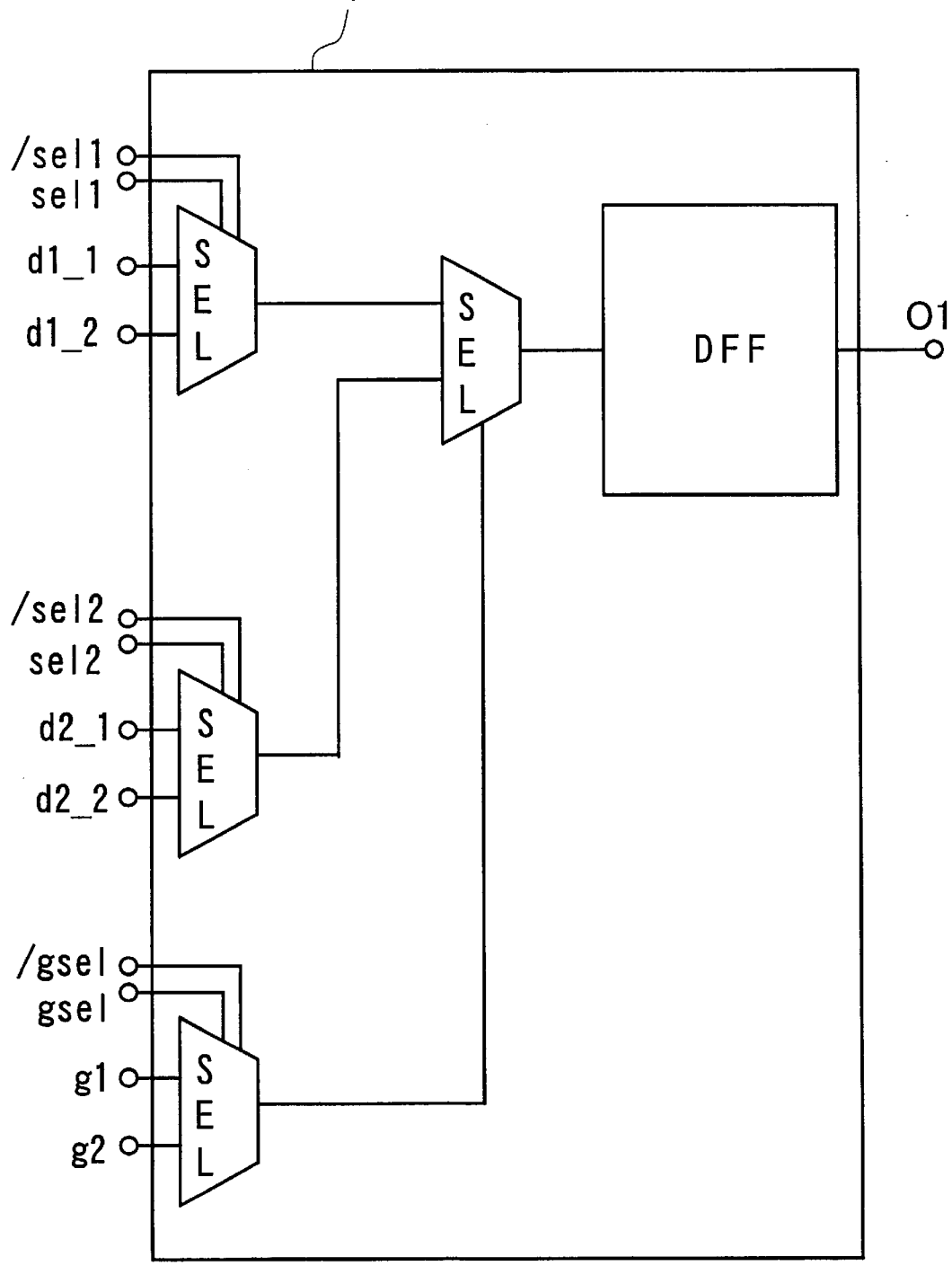
FIG. 11 shows an equivalent circuit of the circuit shown in FIG. 10.

FIG. 11 shows an equivalent circuit of the four-input flip-flop circuit with a data-selecting function of this example that has the foregoing components. In the two-input flip-flop circuit with a data-selecting function, a latch included in a master stage of a conventional D flip-flop circuit having a master/slave structure is duplicated in order to add a data-selecting function. In the four-input flip-flop circuit with a data-selecting function of this example, a latch included in a slave stage is also duplicated in order to realize the data-selecting function for selecting any of four inputs. The truth table indicating the action of the four-input flip-flop circuit with a data-selecting function is as shown in FIG. 18.

When the four-input flip-flop circuit with a data-selecting function of this example is compared with the two-input flip-flop circuit with a data-selecting function, the number of selectable data items is larger. However, the number of circuit elements located along the path of data remains unchanged. The flip-flop circuit of this example therefore acts at the same speed as the two-input flip-flop circuit with a data-selecting function. In other words, even in this example, despite the addition of the data-selecting function for selecting any of four inputs, circuit elements located along the path of data from each input data port d1_1, d1_2, d2_1, or d2_2 to the output port O1 are four logic gates. The logic gates include two transmission gates and two inverters. The number of circuit elements is the same as that in the conventional D flip-flop circuit shown in FIG. 2. The data-selecting function for selecting any of four inputs can be added with a delay time held intact.

The four-input flip-flop circuit with a data-selecting function is characterized by the capability of a selector. The capability of a selector is realized by multiplying a transmission gate originally included in a D flip-flop and selecting any of transmission gates exclusively. Owing to this constituent feature, a data-selecting function is realized without an increase in the number of circuit elements located along a signal propagation path from a data input port to an output port. A circuit element is added to any position other than the signal propagation path and used for control. Specifically, selectors SEL shown in FIG. 11 each have two NOR circuits for receiving two inputs. In a master stage, a clock signal is applied to ones of the input terminals of the NOR circuits. When the clock is low, either of transmission gates is turned on. When the clock is high, both the transmission gates are turned off. Thus, a latch included in the master stage performs a required action, and the selecting function is added.

A simulation performed on the assumption that the flip-flop circuit of this example is manufactured using a 0.25-μm CMOS device technology demonstrates that an action at 2 GHz or more is possible.

THIRD EXAMPLE

Figure 15:
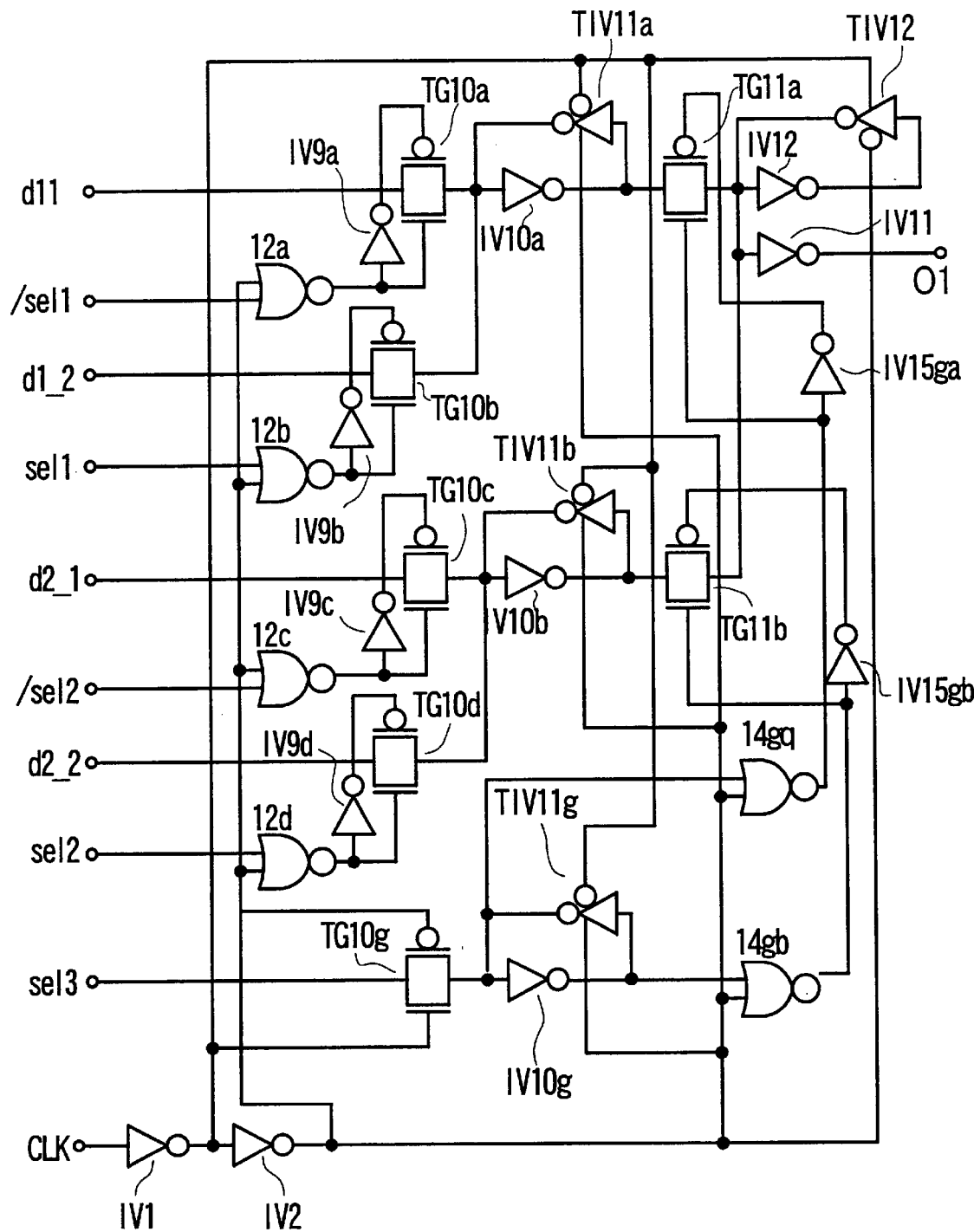
FIG. 15 is a circuit diagram showing still another example of a logic circuit in accordance with the present invention, that is, a four-input flip-flop circuit with a data-selecting function.

FIG. 15 is a circuit diagram showing another example of a logic circuit in accordance with the present invention, that is, a four-input flip-flop circuit with a data-selecting function. A difference from the second example lies in that a gate-selecting circuit having a select signal port sel3 is substituted for the gate-selecting circuit for selecting either of two input data items selected by the two master stages. The gate-selecting circuit for selecting either of two input data items selected by the two master stages includes the input ports g1 and g2 and gate-selecting ports gsel and /gsel.

Figure 19:
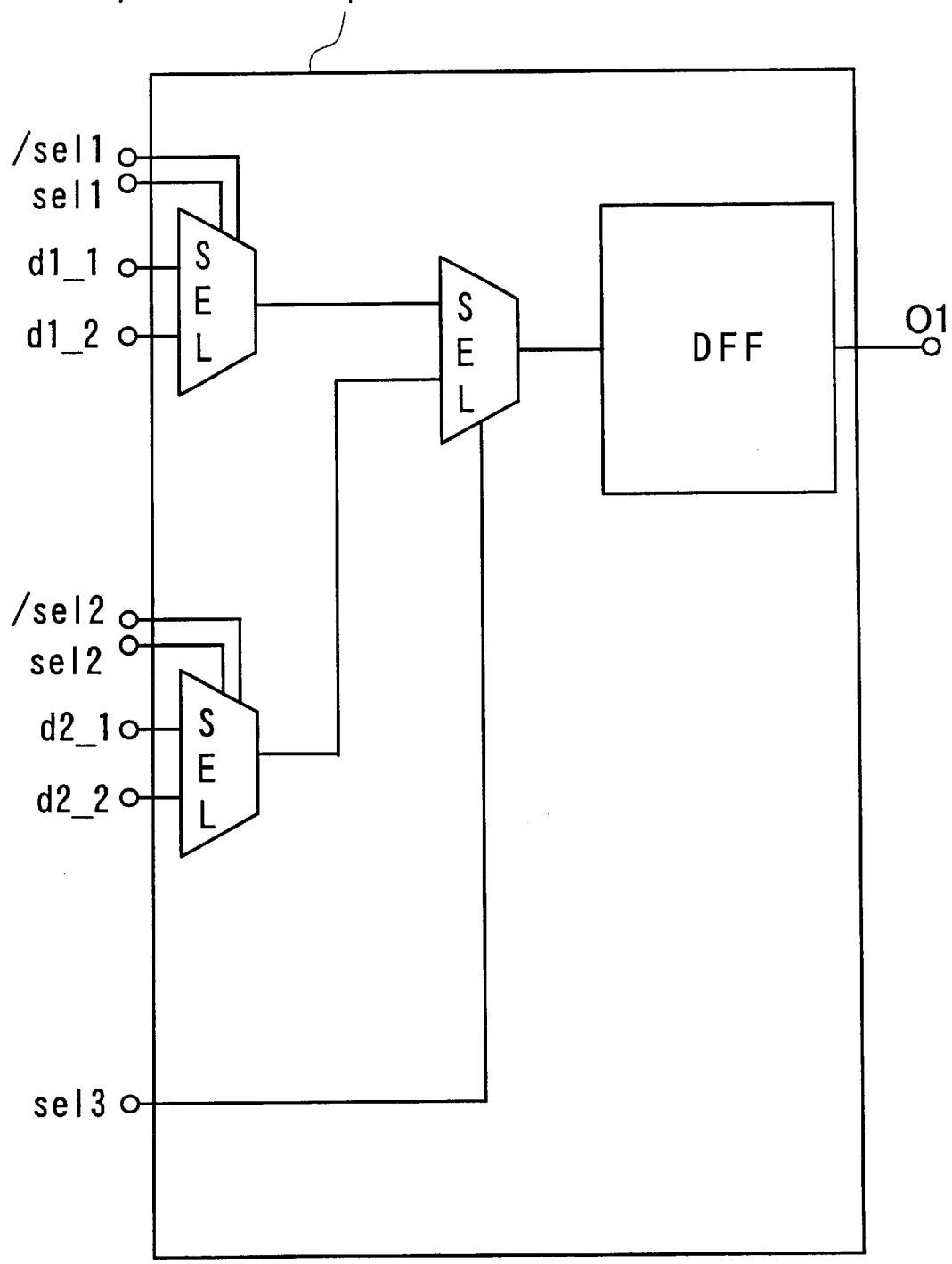
FIG. 19 shows an equivalent circuit of the circuit shown in FIG. 15.

To be more specific, a transmission gate TG10g acting synchronously with a clock signal CLK or /CLK is substituted for the transmission gate TG10ga shown in FIG. 10. The NOR circuits 12ga and 12gb and the inverters IV9ga and IV9gb which are shown in FIG. 10 are excluded. FIG. 16 is a truth table indicating the action of the four-input flip-clop circuit with a data-selecting function of this example. FIG. 19 shows an equivalent circuit consisting of a D flip-flop circuit DFF and selectors SEL. As apparent from comparison with FIG. 11, there is the advantage that a smaller number of selectors is needed to allow the circuit to act in the same manner. Similarly to the second example, despite the addition of the selecting function, circuit elements located along the path of data from the input data port d1_1, d1_2, d2_1, or d2_2 to the output port O1 are four logic gates. That is to say, the same number of logic gates as that in the conventional flip-flop circuit shown in FIG. 2 is located along the data path. Compared with the second example, the circuitry of this example has a smaller number of circuit elements employed. From this viewpoint, this example is more advantageous because an area required is smaller.

FOURTH EXAMPLE

Figure 12:
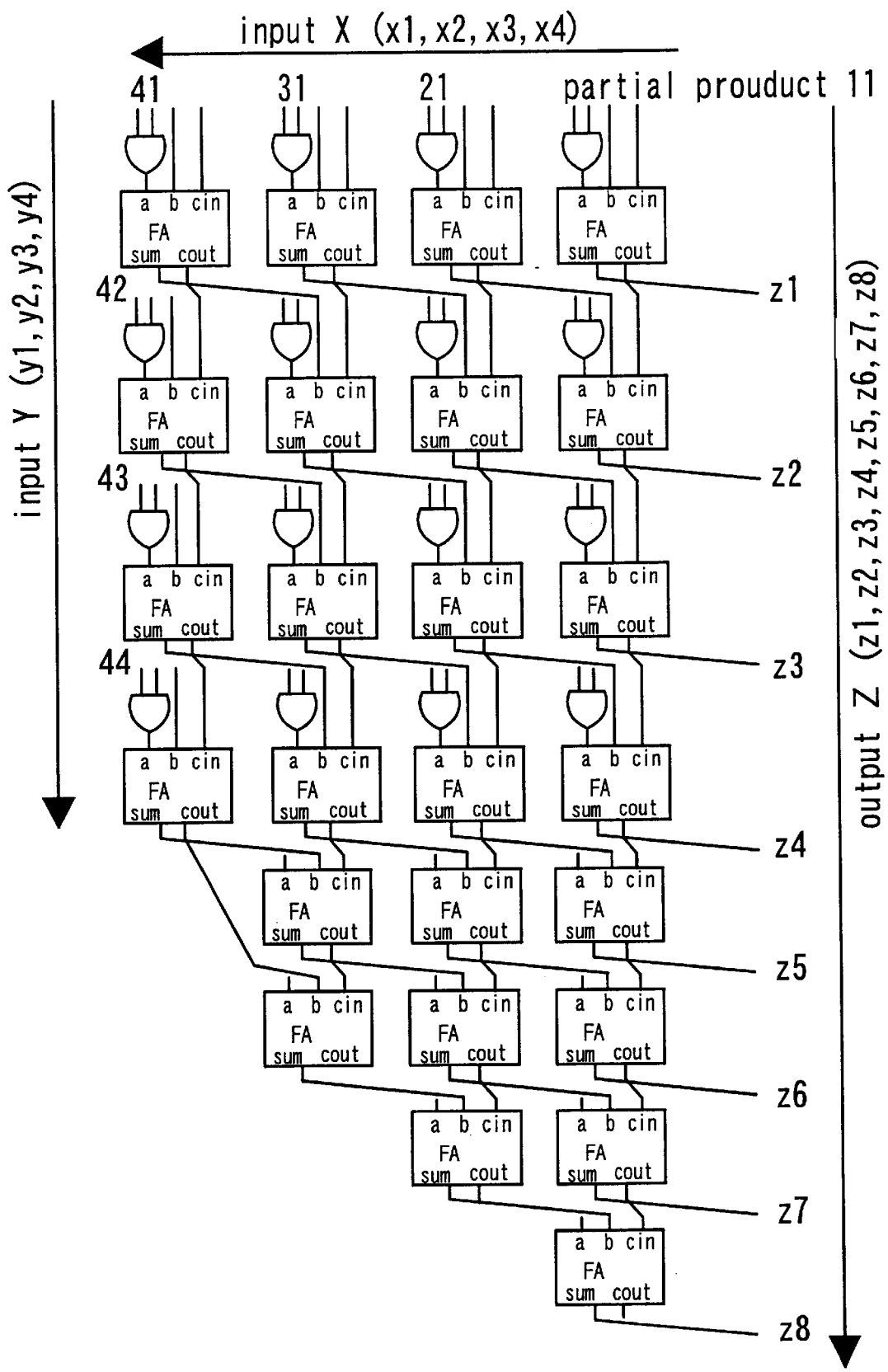
FIG. 12 shows an example of a pipeline multiplier to which a logic circuit in accordance with the present invention is adapted.

FIG. 12 is a circuit diagram showing still another example of a logic circuit in accordance with the present invention, wherein a pipeline multiplier for multiplying fourbits by fourbits is designed using a flip-flop circuit with a function. In FIG. 12, an input X has four bits x1, x2, x3, and x4, and an input Y has four bits y1, y2, y3, and y4. Partial products 11, 21, 31, and 41 are products of x1×y1, x2×y1, x3×y1, and x4×y1 respectively. Partial products 41, 42, 43, and 44 are products of x4×y1, x4×y2, x4×y3, and x4×y4 respectively. Bits z1, z2, etc. of an output Z have values resulting from the calculations of x1×y1, x2×y1+x1×y2, etc.

Figure 13A:
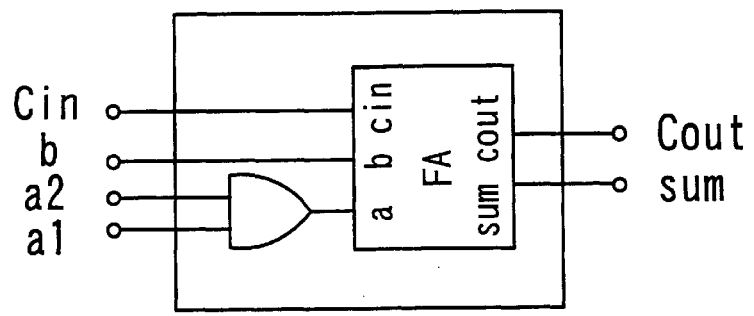
FIG. 13A shows a unit cell of the pipeline multiplier shown in FIG. 12.
Figure 13B:
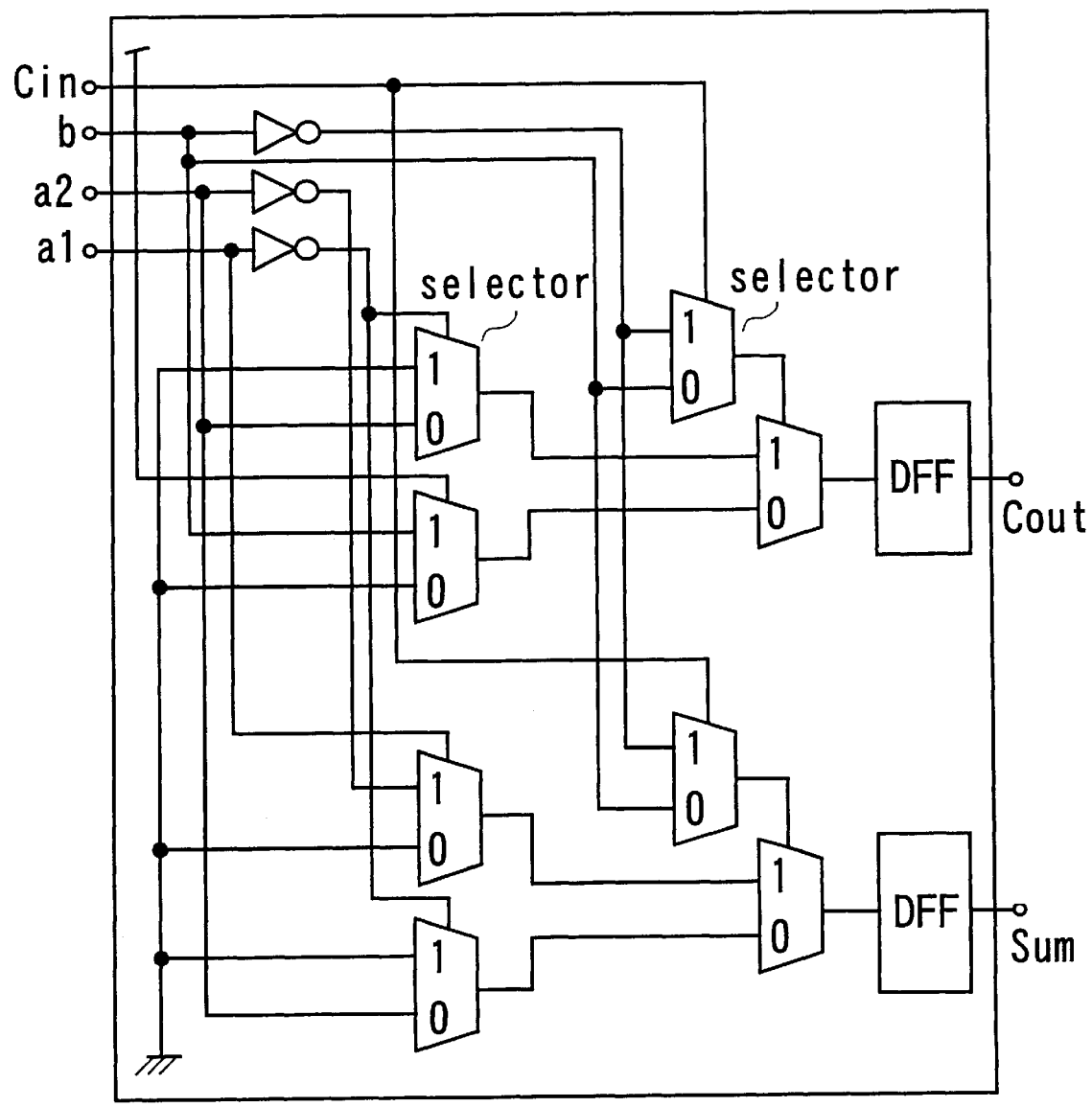
FIG. 13B shows the internal circuitry of the unit cell.

The multiplier has a carry-save structure and is formed with a combination of unit cells that function as shown in FIG. 13A and FIG. 13B. FIG. 13A is a block diagram showing the circuitry of a unit cell composed of a full adder FA and an AND circuit for receiving two inputs. The unit cell has two input ports a and b through which an augend and an addend are received, a carry input port Cin, a carry output port Cout, and a sum output port sum. The unit cell consists of, as shown in FIG. 13B, two circuits each composed of a D flip-flop circuit DFF and four selectors for receiving two inputs, and three inverters. In FIG. 13B, "1" and "0" written in each two-input selector denotes input terminals to be selected based on a select signal. When the select signal represents 1, the input terminal 1 is selected. When the select signal represents 0, the input terminal 0 is selected.

The two circuits each composed of a D flip-flop circuit DFF and four two-input selectors are realized using two four-input flip-flop circuits with a data-selecting function of the second example. In the pipeline multiplier of this example composed of the flip-flop circuits with a function, a combinational circuit connected between the flip-flop circuits with a function is only an inverter for producing a reverse signal. The distance between the flip-flop circuits with a function is therefore short. A cycle time required by the pipeline multiplier is calculated as follows:

cycle time=(setup time required by the flip-flop circuits with a function)+(delay time caused by the flip-flop circuits with a function)+(delay time caused by the inverter)

A simulation is performed on a circuit supposed to be manufactured using the 0.25-μm CMOS device technology as a manufacturing technology for manufacturing devices constituting the multiplier. The simulation demonstrates that the cycle time falls within 500 ps and the multiplier can acts at 2 GHz or more.

As apparent from the aforesaid examples, the employment of a logic circuit in accordance with the present invention, which acts as a flip-flop circuit with a function, makes it possible to reduce a cycle time required by a synchronous circuit that acts synchronously with a clock signal. In particular, when the flip-flop circuit with a function in accordance with the present invention is adapted to a pipeline circuit like the one of an example, a cycle time required by the pipeline circuit can be reduced effectively.

The preferred embodiment and examples of the present invention have been described so far. The present invention will not be limited to the examples. Various changes in a design can be made within the spirit and scope of the present invention.

What is claimed is:

1. A logic circuit having first and second data input ports, first and second select signal input ports, a reference signal port, and an output port, wherein:
    either of first and second data items input through said first and second data input ports is selected based on select signals of opposite polarities input through said first and second select signal input ports; and
    data selected based on said select signals is output through said output port synchronously with a reference signal input through said reference signal input port,
    said logic circuit comprising:
       a first inverter having an output terminal thereof connected to a first transmission gate;
       a second inverter having an output terminal thereof connected to said output port;
       a first NOR circuit having said first select signal input port connected to one input terminal thereof and having said reference signal applied to the other input terminal thereof;
       a second NOR circuit having said second select signal input port connected to one input terminal thereof and having said reference signal applied to the other input terminal thereof;
       a first transmission gate connected between said first data input port and the input terminal of said first inverter, and controlled based on an output of said first NOR circuit;
       a second transmission gate connected between said second data input port and the input terminal of said first inverter, and controlled based on an output of said second NOR circuit; and
       a third transmission gate connected between said first and second inverters, and controlled based on said reference signal input through said reference signal input port.

2. A logic circuit according to claim 1, wherein:
    said first, second, and third transmission gates are formed with n-channel field-effect transistors and p-channel field-effect transistors;
    signals used to control said first and second transmission gates include output signals of said first and second NOR circuits and the reverse signals of the output signals; and
    signals used to control said third transmission gate include said reference signal and the reverse signal of said reference signal.

3. A logic circuit according to claim 1, wherein: a first tristate inverter forming a loop together with said first inverter is included for realizing a first latch circuit; and a second latch circuit composed of a second tristate inverter and a third inverter is connected to the input terminal of said second inverter.

4. A logic circuit having first, second, third, and fourth data input ports, first, second, third, and fourth select signal input ports, first and second gate input ports, first and second gate-selecting ports, a reference signal input port, and an output port, wherein:
    either of data items input through said first and second data input ports is selected based on first and second select signals of opposite polarities input through said first and second select signal input ports;
    either of data items input through said third and fourth data input ports is selected based on third and fourth select signals of opposite polarities input through said third and fourth select signal input ports;
    either of gate input data items input through said first and second gate input ports is selected based on first and second gate select signals of opposite polarities input through said first and second gate-selecting ports;
    either of data selected based on said first and second select signals and data selected based on said third and fourth select signals is selected based on gate input data selected based on said first and second gate select signals, and output through said output port synchronously with a reference signal input through said reference signal input port,
    said logic circuit comprising:
       a circuit for selecting either of data items input through said first and second data input ports that consists of: a first inverter having an output terminal thereof connected to a first transmission gate; a first NOR circuit having said first select signal input port connected to one input terminal thereof and having said reference signal applied to the other input terminal thereof; a second NOR circuit having said second select signal input port connected to one input terminal thereof and having said reference signal applied to the other input terminal thereof; a second transmission gate connected between said first data input port and the input terminal of said first inverter, and controlled based on an output of said first NOR circuit; and a third transmission gate connected between said second data input port and the input terminal of said first inverter, and controlled based on an output of said second NOR circuit;
       a circuit for selecting either of data items input through said third and fourth data input port that consists of: a second inverter having an output terminal thereof connected to a fourth transmission gate; a third NOR circuit having said third select signal input port connected to one input terminal thereof and having said reference signal applied to the other input terminal thereof; a fourth NOR circuit having said fourth select signal input port connected to one input terminal thereof, and having said reference signal applied to the other terminal thereof; a fifth transmission gate connected between said third data input port and the input terminal of said second inverter, and controlled based on an output of said third NOR circuit; and a sixth transmission gate connected between said fourth data input port and the input terminal of said second inverter, and controlled based on an output of said fourth NOR circuit;

a circuit for selecting either of gate input data items input through said first and second data input ports that consists of: a third inverter; a fifth NOR circuit having said first gate-selecting port connected to one input terminal thereof and having said reference signal applied to the other input terminal thereof; a sixth NOR circuit having said second gate-selecting port connected to one input terminal thereof and having said reference signal applied to the other input terminal thereof; a seventh transmission gate connected between said first gate input port and the input terminal of said third inverter and controlled based on an output of said fifth NOR circuit; and an eighth transmission gate connected between said second gate input port and the input terminal of said third inverter and controlled based on an output of said sixth NOR circuit; and a circuit for selecting either of data selected based on said first and second select signals and data selected based on said third and fourth select signals according to said selected gate input data that consists of: a seventh NOR circuit having the output terminal of said seventh transmission gate connected to one input terminal thereof, having said reference signal applied to the other input terminal thereof, and having an output terminal thereof connected to a control gate of said first transmission gate; and an eighth NOR circuit having the output terminal of said third inverter connected to one input terminal thereof, having said reference signal applied to the other input terminal thereof, and having an output terminal thereof connected to a control gate of said fourth transmission gate; and a fourth inverter for outputting data selected based on said selected gate input data through said output port that has an input terminal thereof connected to said first transmission gate and fourth transmission gate and that has an output terminal thereof connected to said output port.

5. A logic circuit according to claim 4, wherein:

said first to eighth transmission gates are each composed of an n-channel field-effect transistor and a p-channel field-effect transistor;

signals used to control said first transmission gate include an output signal of said seventh NOR circuit and the reverse signal of the output signal;

signals used to control said second transmission gate include an output signal of said first NOR circuit and the reverse signal of the output signal;

signals used to control said third transmission gate include an output signal of said second NOR circuit and the reverse signal of the output signal;

signals used to control said fourth transmission gate include an output signal of said eighth NOR circuit and the reverse signal of the output signal;

signals used to control said fifth transmission gate include an output signal of said third NOR circuit and the reverse signal of the output signal;

signals used to control said sixth transmission gate include an output signal of said fourth NOR circuit and the reverse signal of the output signal;

signals used to control said seventh transmission signal include an output signal of said fifth NOR circuit and the reverse signal of the output signal; and signals used to control said eighth transmission gate include an output signal of said sixth NOR circuit and the reverse signal of the output signal.

6. A logic circuit according to claim 4, wherein:

a first tristate inverter forming a loop together with said first inverter is included for realizing a first latch circuit;

a second tristate inverter forming a loop together with said second inverter is included for realizing a second latch circuit;

a third tristate inverter forming a loop together with said third inverter is included for realizing a third latch circuit; and a fourth latch circuit composed of a fourth tristate inverter and a fifth inverter is connected to the input terminal of said fourth inverter.

7. A logic circuit having first, second, third, and fourth data input ports, first, second, third, fourth, and fifth select signal input ports, a reference signal input port, and an output port, wherein:

either of data items input through said first and second data input ports is selected based on first and second select signals of opposite polarities input through said first and second select signal input ports;

either of data items input through said third and fourth data input ports is selected based on third and fourth select signals of opposite polarities input through said third and fourth select signal input ports;

either of data selected based on said first and second select signals and data selected based on said third and fourth select signal is selected based on a fifth select signal input through said fifth select signal input port, and output through said output port synchronously with a reference signal input through said reference signal input port, said logic circuit comprising:

a circuit for selecting either of data items input through said first and second data input ports that consists of: a first inverter having an output terminal thereof connected to a first transmission gate; a first NOR circuit having said first select signal input port connected to one input terminal thereof and having said reference signal applied to the other input terminal thereof; a second NOR circuit having said second select signal input port connected to one input terminal thereof and having said reference signal applied to the other input terminal thereof; a second transmission gate connected between said first data input port and the input terminal of said first inverter and controlled based on an output of said first NOR circuit; and a third transmission gate connected between said second data input port and the input terminal of said first inverter and controlled based on an output of said second NOR circuit;

a circuit for selecting either of data items input through said third and fourth data input ports that consists of: a second inverter having an output terminal thereof connected to a fourth transmission gate; a third NOR circuit having said third select signal input port connected to one input terminal thereof and having said reference signal applied to the other input terminal thereof; a fourth NOR circuit having said fourth select signal input port connected to one input terminal thereof and having said reference signal applied to the other input terminal thereof; a fifth transmission gate connected between said third data input port and the input terminal of said second inverter and controlled based on an output of said third NOR circuit; and a sixth transmission gate connected between said fourth data input port and the input terminal of said second inverter and controlled based on an output of said fourth NOR circuit;

a circuit for selecting either of data selected based on said first and second select signal and data selected based on said third and fourth select signal that consists of: a third inverter; a seventh transmission gate having an input terminal thereof connected to said fifth select signal input port and having an output terminal thereof connected to the input terminal of said third inverter; a fifth NOR circuit having an output terminal of said seventh transmission gate connected to one input terminal thereof, having said reference signal applied to the other input terminal thereof, and having an output terminal thereof connected to a control gate of said first transmission gate; and a sixth NOR circuit having an output terminal of said third inverter connected to one input terminal thereof, having said reference signal applied to the other input terminal thereof, and having an output terminal thereof connected to a control gate of said fourth transmission gate; and a fourth inverter for outputting said selected data through said output port that has an input terminal thereof connected to said first transmission gate and fourth transmission gate and that has an output terminal thereof connected to said output port.

8. A logic circuit according to claim 7, wherein:

said first to seventh transmission gates are each composed of an n-channel field-effect transistor and a p-channel field-effect transistor;

signals used to control said first transmission gate include an output signal of said fifth NOR circuit and the reverse signal of the output signal;

signals used to control said second transmission gate include an output signal of said first NOR circuit and the reverse signal of the output signal;

signals used to control said third transmission gate include an output signal of said second NOR circuit and the reverse signal of the output signal;

signals used to control said fourth transmission gate include an output signal of said sixth NOR circuit and the reverse signal of the output signal;

signals used to control said fifth transmission gate include an output signal of said third NOR circuit and the reverse signal of the output signal;

signals used to control said sixth transmission gate include an output signal of said fourth NOR circuit and the reverse signal of the output signal; and signals used to control said seventh transmission gate include said reference signal and the reverse signal of said reference signal.

9. A logic circuit according to claim 7, wherein:

a first tristate inverter forming a loop together with said first inverter is included for realizing a first so latch circuit;

a second tristate inverter forming a loop together with said second inverter is included for realizing a second latch circuit;

a third tristate inverter forming a loop together with said third inverter is included for realizing a third latch circuit; and a fourth latch circuit composed of a fourth tristate inverter and a fifth inverter is connected to the input terminal of said fourth inverter.

* * * * *